(12) United States Patent
Cheng et al.

(10) Patent No.: US 10,622,259 B2
(45) Date of Patent: Apr. 14, 2020

(54) SEMICONDUCTOR DEVICES WITH SIDEWALL SPACERS OF EQUAL THICKNESS

(71) Applicant: INTERNATIONAL BUSINESS MACHINES CORPORATION, Armonk, NY (US)

(72) Inventors: Kangguo Cheng, Schenectady, NY (US); Balasubramanian Pranatharthiharan, Watervliet, NY (US); Soon-Cheon Seo, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/797,208

(22) Filed: Oct. 30, 2017

(65) Prior Publication Data
US 2018/0069007 A1  Mar. 8, 2018

Related U.S. Application Data

(63) Continuation of application No. 15/272,874, filed on Sep. 22, 2016, now Pat. No. 9,887,198, which is a
(Continued)

(51) Int. Cl.
*H01L 21/8238* (2006.01)
*H01L 27/092* (2006.01)
(Continued)

(52) U.S. Cl.
CPC .. *H01L 21/823864* (2013.01); *H01L 21/0257* (2013.01); *H01L 21/31111* (2013.01);
(Continued)

(58) Field of Classification Search
None
See application file for complete search history.

(56) References Cited

U.S. PATENT DOCUMENTS

| 5,079,180 A | 1/1992 | Rodder et al. |
| 5,714,413 A | 2/1998 | Brigham et al. |
| (Continued) | | |

FOREIGN PATENT DOCUMENTS

GB        2362029 A        11/2001

OTHER PUBLICATIONS

List of IBM Patents or Patent Applications Treated as Related 1 page.
(Continued)

*Primary Examiner* — Seahvosh Nikmanesh
*Assistant Examiner* — Xiaoming Liu
(74) *Attorney, Agent, or Firm* — Alvin Borromeo; Andrew M. Calderon; Roberts Mlotkowski Safran Cole & Calderon, P.C.

(57) ABSTRACT

Semiconductor structures with different devices each having spacers of equal thickness and methods of manufacture are disclosed. The method includes forming a first gate stack and a second gate stack. The method further includes forming sidewall spacers of equal thickness for both the first gate stack and the second gate stack by depositing a liner material over spacer material on sidewalls of the first gate stack and the second gate stack and within a space formed between the spacer material and source and drain regions of the first gate stack.

20 Claims, 4 Drawing Sheets

Related U.S. Application Data continuation of application No. 14/504,964, filed on Oct. 2, 2014, now Pat. No. 9,502,418.

(51) Int. Cl.
| | | |
|---|---|---|
| *H01L 21/311* | (2006.01) | |
| *H01L 29/66* | (2006.01) | |
| *H01L 29/08* | (2006.01) | |
| *H01L 29/417* | (2006.01) | |
| *H01L 29/78* | (2006.01) | |
| *H01L 21/02* | (2006.01) | |
| *H01L 21/84* | (2006.01) | |
| *H01L 27/12* | (2006.01) | |
| *H01L 29/49* | (2006.01) | |
| *H01L 29/51* | (2006.01) | |

(52) U.S. Cl.
CPC .............. *H01L 21/31116* (2013.01); *H01L 21/823814* (2013.01); *H01L 21/823821* (2013.01); *H01L 21/823828* (2013.01); *H01L 21/845* (2013.01); *H01L 27/092* (2013.01); *H01L 27/0924* (2013.01); *H01L 27/1211* (2013.01); *H01L 29/0847* (2013.01); *H01L 29/41783* (2013.01); *H01L 29/4983* (2013.01); *H01L 29/517* (2013.01); *H01L 29/6653* (2013.01); *H01L 29/66628* (2013.01); *H01L 29/66636* (2013.01); *H01L 29/78* (2013.01); *H01L 27/1203* (2013.01)

(56) References Cited

U.S. PATENT DOCUMENTS

| | | | |
|---|---|---|---|
| 6,326,664 | B1 | 12/2001 | Chau et al. |
| 6,911,695 | B2 | 6/2005 | Ahmed et al. |
| 8,222,100 | B2 | 7/2012 | Cheng et al. |
| 9,502,418 | B2 | 11/2016 | Cheng et al. |
| 9,576,961 | B2 | 2/2017 | Cheng et al. |
| 9,887,198 | B2 * | 2/2018 | Cheng ............... H01L 27/0924 |
| 2006/0157797 | A1 | 7/2006 | Tateshita |
| 2006/0194381 | A1 | 8/2006 | Wei et al. |
| 2006/0220152 | A1 | 10/2006 | Huang et al. |
| 2007/0069309 | A1* | 3/2007 | Lindsay ............... H01L 29/105 257/408 |
| 2008/0164491 | A1 | 7/2008 | Liu et al. |
| 2008/0230815 | A1 | 9/2008 | Ekbote et al. |
| 2008/0272438 | A1* | 11/2008 | Doris ............... H01L 21/28176 257/369 |
| 2010/0078735 | A1* | 4/2010 | Hoentschel ........ H01L 29/665 257/408 |
| 2010/0109056 | A1* | 5/2010 | Pal ............... H01L 21/28114 257/288 |
| 2010/0244198 | A1 | 9/2010 | Jaeger et al. |
| 2011/0037125 | A1 | 2/2011 | Cheng et al. |
| 2011/0049630 | A1 | 3/2011 | Majumdar et al. |
| 2011/0223736 | A1 | 9/2011 | Lin et al. |
| 2012/0217554 | A1* | 8/2012 | Lee ............... H01L 29/66795 257/288 |
| 2012/0223407 | A1 | 9/2012 | Scheiper et al. |
| 2013/0015525 | A1 | 1/2013 | Cheng et al. |
| 2013/0155368 | A1 | 6/2013 | Niikura et al. |
| 2013/0313651 | A1* | 11/2013 | Cheng ............... H01L 27/0629 257/369 |
| 2013/0341685 | A1 | 12/2013 | Chou et al. |
| 2014/0159052 | A1* | 6/2014 | Liu ............... H01L 29/6659 257/77 |
| 2014/0231916 | A1 | 8/2014 | Giraud et al. |
| 2015/0145073 | A1 | 5/2015 | Lee et al. |
| 2015/0200042 | A1* | 7/2015 | Ling ............... H01B 19/04 216/13 |
| 2015/0263169 | A1 | 9/2015 | Gu et al. |
| 2016/0099245 | A1 | 4/2016 | Cheng et al. |
| 2016/0099322 | A1 | 4/2016 | Cheng et al. |
| 2017/0011970 | A1 | 1/2017 | Cheng et al. |
| 2017/0069548 | A1 | 3/2017 | Liu |
| 2017/0117193 | A1 | 4/2017 | Cheng et al. |

OTHER PUBLICATIONS

Miles, "Nitride Encapsulated Spacer", published as IPCOM000038176D, Jan. 31, 2005, 2 pages.

Notice of Allowance dated Sep. 28, 2017 in related U.S. Appl. No. 15/272,874, 32 pages.

Office Action in related U.S. Appl. No. 15/827,058 dated Jan. 4, 2019, 17 pages.

Notice of Allowance in U.S. Appl. No. 15/827,058 dated Jun. 24, 2019, 9 pages.

Notice of Allowance in related U.S. Appl. No. 15/827,058 dated Oct. 30, 2019, 8 pages.

* cited by examiner

SEMICONDUCTOR DEVICES WITH SIDEWALL SPACERS OF EQUAL THICKNESS

FIELD OF THE INVENTION

The invention relates to semiconductor structures and, more particularly, to semiconductor structures with different devices each having spacers of equal thickness and methods of manufacture.

BACKGROUND

In CMOS technologies, NFET and PFET devices are optimized to achieve required design performance. This optimization can include doping concentrations, material selections and dimensions. For example, in conventional CMOS technologies, and particularly in dual EPI process schemes for source and drain formation, both the NFET and PFET devices share many of the same processes and topology to reduce manufacturing costs and provide optimal performance, where possible. However, in current process schemes, and in particular dual EPI process schemes, the spacer thickness of the NFET and PFET devices are different, with the NFET device having a thicker spacer than the PFET devices. This thicker spacer leads to degraded device performance due to longer proximity to the channel.

SUMMARY

In an aspect of the invention, a method comprises forming a first gate stack and a second gate stack. The method further comprises forming sidewall spacers of equal thickness for both the first gate stack and the second gate stack by depositing a liner material over spacer material on sidewalls of the first gate stack and the second gate stack and within a space formed between the spacer material and source and drain regions of the first gate stack.

In an aspect of the invention, a method comprises forming a first gate stack and a second gate stack and forming a spacer material over the first gate stack and the second gate stack. The method further comprises forming source and drain regions abutting the spacer material of the first gate stack. The method further comprises creating a space between the source and drain regions and the spacer material of the first gate stack. The method further comprises depositing a liner material over the spacer material of the first gate stack and the second gate stack and within the space between the source and drain regions and the spacer material of the first gate stack to form sidewall spacers for both the first gate stack and the second gate stack. The method further comprises removing the liner material and the spacer material on a surface adjacent to the second gate stack. The method further comprises forming source and drain regions on the surface adjacent to the second gate stack.

In an aspect of the invention, a structure comprises a first gate structure comprising a sidewall spacer abutting raised source and drain regions, and a second gate structure comprising a sidewall spacer abutting raised source and drain regions. The sidewall spacer of the first gate structure has a same thickness as the sidewall spacer of the second gate structure. The sidewall spacer of the first gate structure and the sidewall spacer of the second gate structure comprise a combination of a spacer material and a liner material.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to semiconductor structures with different devices each having spacers of equal thickness and methods of manufacture. More specifically, the present invention comprises NFET and PFET devices formed on a same substrate, each having a raised source and drain region and sidewall spacer with the same thickness. Advantageously, the same sidewall spacer thickness for both NFET and PFET devices will improve device performance, compared to conventional processes/structures where the spacer thickness of the NFET device is typically thicker than the spacer thickness for the PFET device or vice versa.

In embodiments, the NFET and PFET devices can be formed using complementary metal-oxide-semiconductor (CMOS) processes. For example, the semiconductor devices of the present invention can be manufactured in a number of ways using a number of different tools. In general, though, the methodologies and tools are used to form structures with dimensions in the micrometer and nanometer scale. The methodologies, i.e., technologies, employed to manufacture the semiconductor devices of the present invention have been adopted from integrated circuit (IC) technology. For example, the structures of the present invention are built on wafers and are realized in films of material patterned by photolithographic processes on the top of a wafer. In particular, the fabrication of the NFET and PFET devices of the present invention uses three basic building blocks: (i) deposition of films of material on a substrate, (ii) applying a patterned mask on top of the films by photolithographic imaging, and (iii) etching the films selectively to the mask.

Figure 1:
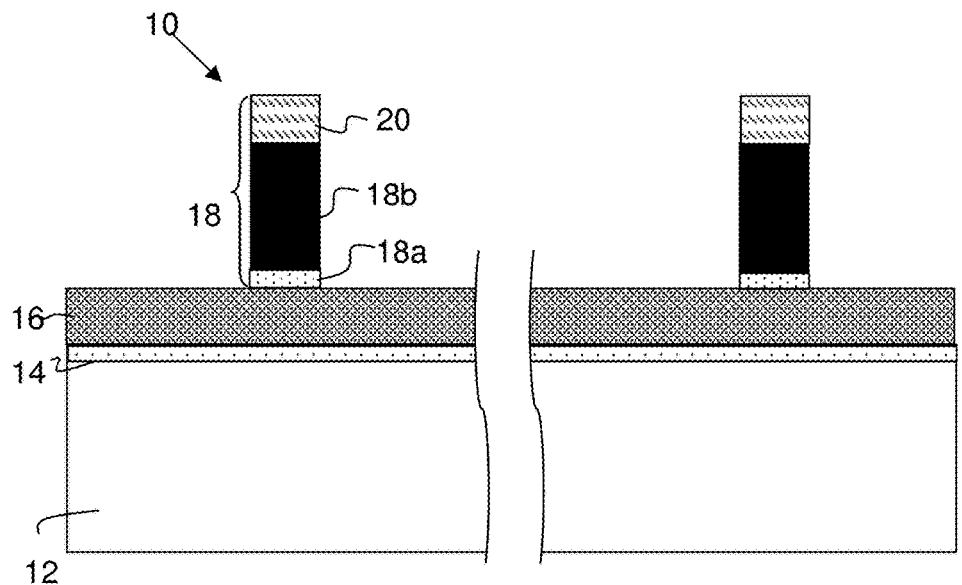
FIGS. 1-8 show structures and respective manufacturing processes in accordance with aspects of the present invention.

FIG. 1 shows a structure and respective processing steps in accordance with aspects of the present invention. In particular, the structure 10 of FIG. 1 can comprise a bulk substrate implementation or silicon on oxide (SOI) implementation. In still further implementations, the structure 10 of the present invention can be applied to planar technologies, finFET technologies and Extremely Thin Silicon on Insulator (ETSOI) FET technologies, with either a gate first or gate last implementation. The gate stack should be understood by those of ordinary skill as a dummy gate or an active gate.

In any scenario, the substrate 12 can be composed of any suitable semiconductor material including, but not limited to, Si, SiGe, SiGeC, SiC, Ge alloys, GaAs, InAs, InP, and other III/V or II/VI compound semiconductors. In the SOI implementation (or bulk), insulator material 14, e.g., oxide, can be formed on the substrate 12, with a semiconductor material 16 formed on the insulator material 14. The semiconductor material 16 can be composed of any suitable semiconductor material as described herein.

In the finFET implementation, the semiconductor material 16 can be patterned to form a plurality of fins (also represented by reference numeral 16, as represented along its longitudinal axis). The plurality of fins 16 can be formed using conventional lithography and etching, e.g., reactive ion etching, processes, or sidewall image transfer (SIT) processes. By way of illustration, in the SIT technique, a mandrel, e.g., $SiO_2$, is deposited on the upper layer of material (e.g., semiconductor material 16), using conventional deposition processes (e.g., chemical vapor deposition (CVD)). A resist is formed on the mandrel material, and exposed to light to form a pattern (openings). A reactive ion etching (RIE) is performed through the openings to form the mandrels. In embodiments, the mandrels can have different widths and/or spacing depending on the desired dimensions between the fin structures. Spacers are formed on the sidewalls of the mandrels which are preferably material that is different than the mandrels, and which are formed using conventional deposition processes known to those of skill in the art. The spacers can have a width which matches the dimensions of the fin structures 16, for example. The mandrels are removed or stripped using a conventional etching process, selective to the mandrel material. An etching is then performed within the spacing of the spacers to form the sub-lithographic features of the fin structures 16. The sidewall spacers can then be stripped.

Still referring to FIG. 1, in any of the above noted implementations, gate stacks 18 are formed using conventional CMOS fabrication processes. Although the following description will be described with reference to finFET implementations for ease of discussion, it should be understood by those of ordinary skill in the art that similar processes can also be used for the other noted implementations such that no further description is needed for a complete understanding of each of the different implementations.

As discussed further herein, in the finFET implementation, for example, a dielectric material 18a is blanket deposited over the fin structures 16 and any other exposed surfaces. In embodiments, the dielectric material 18a can be a high-k dielectric material such as a hafnium based material. A poly or metal materials (of different work functions) 18b are deposited on the dielectric material 18a using conventional CVD processes. A hard mask 20, e.g., SiN or SiN/SiO₂ or other low-k dielectric material, is deposited on the poly or metal materials 18b. The gate stacks 18 are then patterned using conventional lithography and etching, e.g., RIE, processes as already described herein. In embodiments, the gate stack patterning can comprise, for example, single exposure lithography or double patterning (e.g., litho-etch-litho-etch or litho-litho-etch), extreme ultraviolet lithography (EUV) or SIT techniques. In the finFET implementation, the gate stacks 18 are formed orthogonal to a length of the fins 16, thereby extending over several fins.

Figure 2:
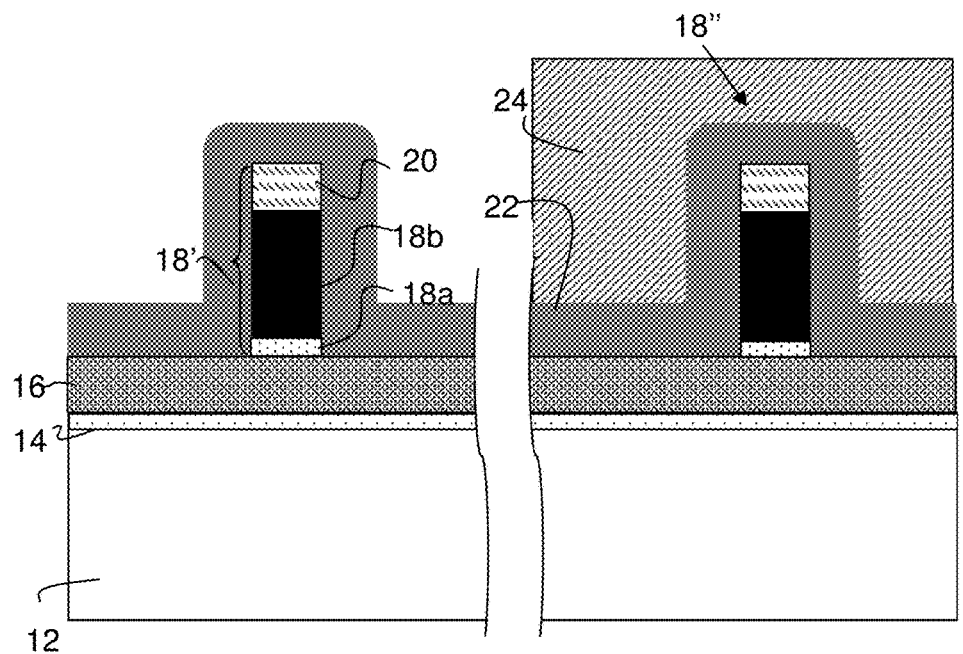

In FIG. 2, a spacer deposition is performed over the structure of FIG. 1, e.g., gate stacks 18' and 18". For example, in embodiments, a first spacer material 22 is blanket deposited over any exposed structures, including the gate stacks 18' and 18". The first spacer material 22 can be, e.g., SiN, SiO₂, SiOCN, SiCN, SiCOH, or any low-K material (where K<6), deposited using a conformal deposition process, e.g., CVD or atomic layer deposition (ALD). The first spacer material 22 can be deposited to a thickness of about 3 nm to 15 nm for 14 nm technology node and beyond. A masking material 24 is then deposited and patterned over the gate stack 18" (e.g., NFET), using conventional deposition and lithography processes as described herein. In embodiments, the masking material 24 can consist of bi-layer resist, e.g., resist and an optical planarization layer (OPL) or tri-layer resist, e.g., resist, Si or Ti containing ARC and OPL, which will be used to protect the gate stack 18" during subsequent processes.

Figure 3:
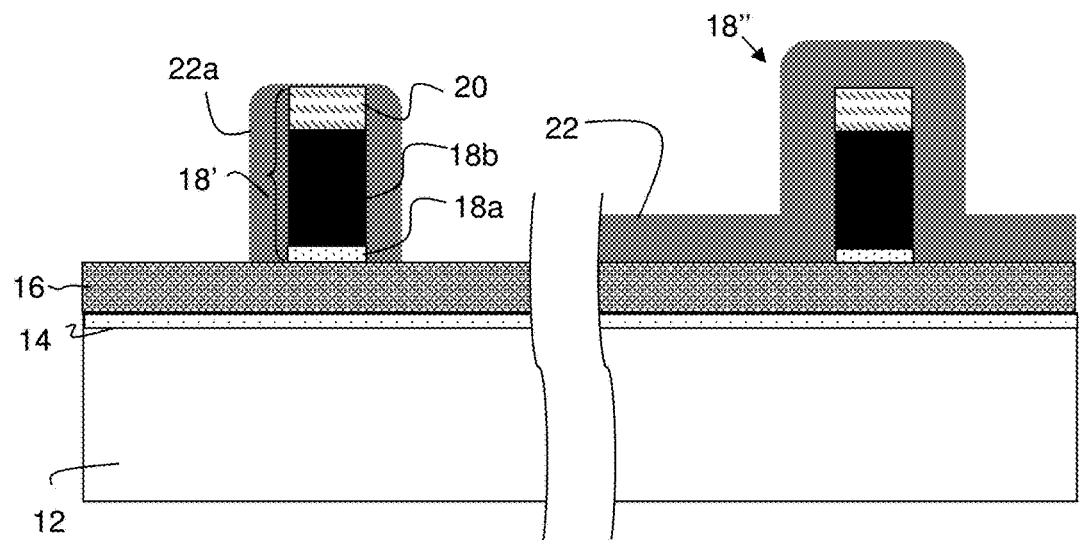

In FIG. 3, the first spacer material 22 on unprotected horizontal surfaces of the structure, e.g., portions of the fins 16, upper surface of the gate stack 18' and portions of the insulator layer 14, are removed using an etching process, e.g., RIE, with a selective chemistry. In embodiments, this etching process is an isotropic etch, which will result in the formation of first sidewall spacer 22a on the gate stack 18' (e.g., PFET). After the etching process, the resist can be removed using conventional stripping processes, e.g., oxygen ashing, etc.

Figure 4:
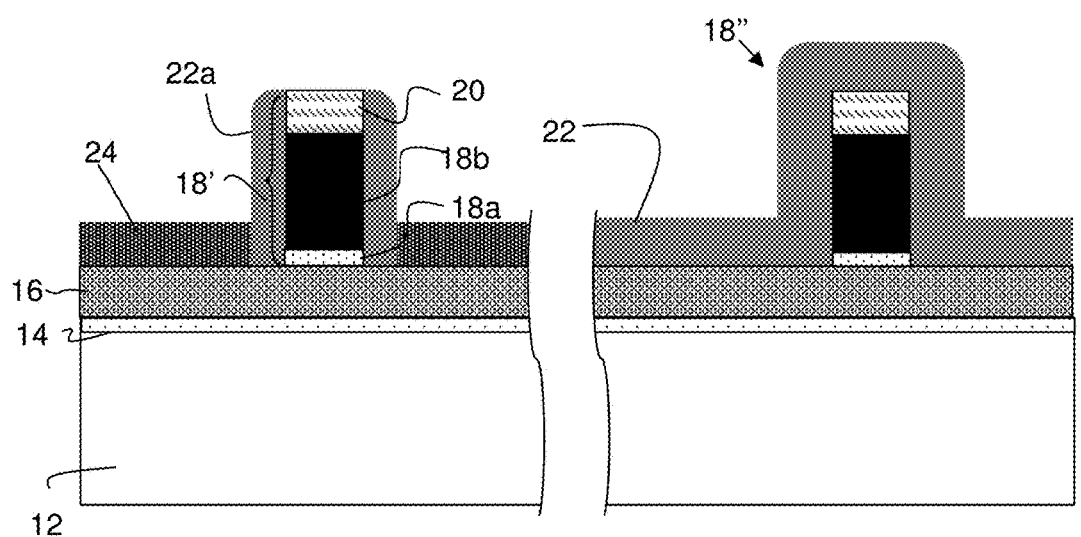

In FIG. 4, a raised source and drain region 24 is formed on sides of the gate stack 18'. In embodiments, the raised source and drain region 24 is formed by an epitaxial growth process of semiconductor material. As shown in FIG. 4, the raised source and drain region 24 will abut directly against the first sidewall spacer 22a of the gate stack 18' (e.g., PFET).

Figure 5:
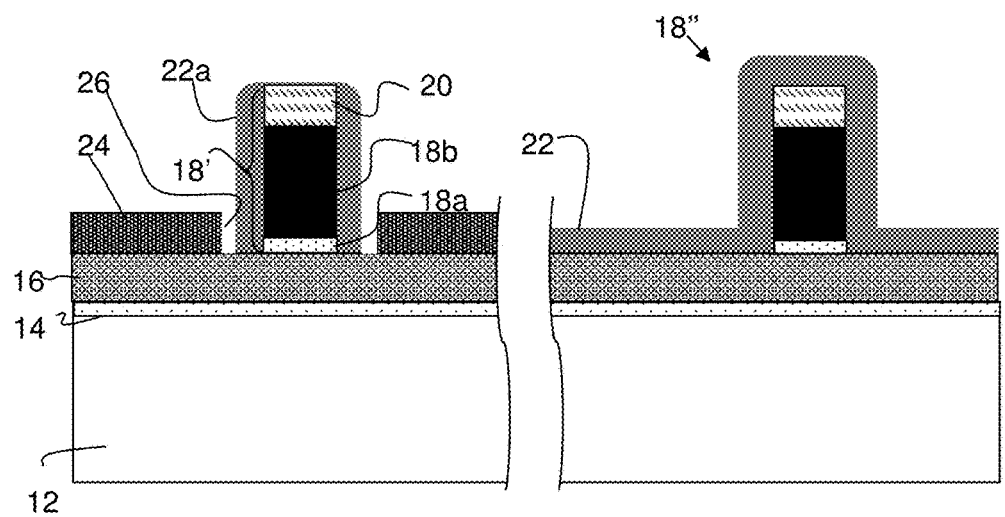

As shown in FIG. 5, for example, the first spacer material 22 including the first sidewall spacer 22a can be thinned using an etching process. For example, the first spacer material 22 over and adjacent to the gate stack 18" and the first sidewall spacer 22a of the gate stack 18' are thinned by an etching process that can comprise a chemistry of hydrofluoric ethylene glycol (HFEG) which is selective to SiN material (e.g., will not significantly affect the material of the source and drain region 24). In an alternative process, the chemistry can be any HF-based wet chemistry for wet isotropic processes. In still another alternative process, the chemistry can be an isotropic dry etch process used with $NF_3/NH_3$ or $NH_3/HF$ based reactants. A certain amount of first sidewall spacer 22a can be etched away leaving a space 26 between the source and drain region 24 and the first sidewall spacer 22a (as well as equivalently thinning the first spacer material 22 over the second gate stack 18"). Although different dimensions of the space 26 are contemplated by the present invention, depending on the technology and performance requirements of the device, one such example can be about 3 nm. The amount of spacer thinning or etching is dependent upon how much liner 28 as shown in FIG. 6 will be deposited.

Figure 6:
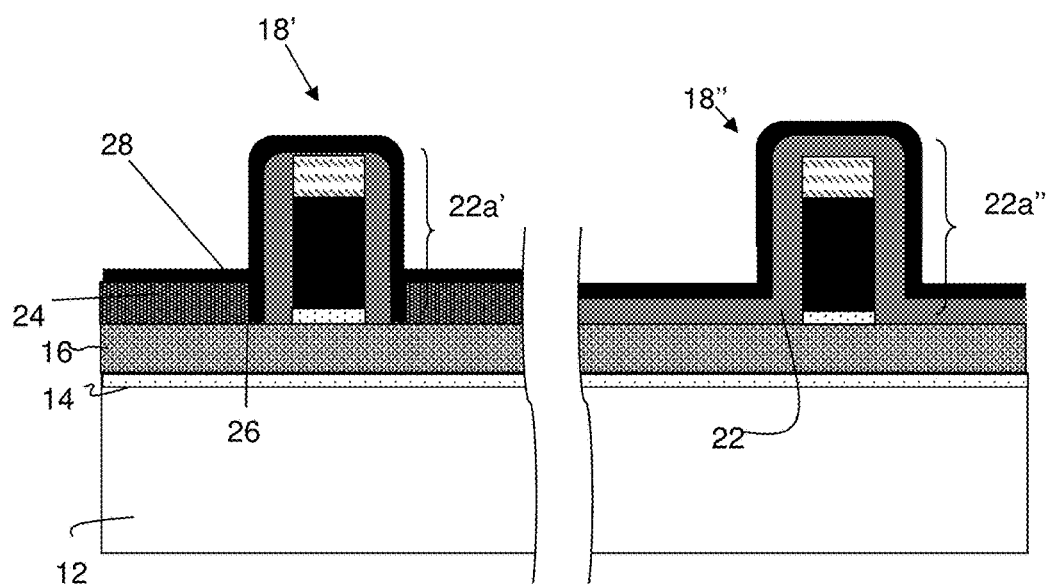

In FIG. 6, a liner 28 is blanket deposited on the surfaces of the structure, e.g., gate stacks 18' and 18". More specifically, the liner 28 will be deposited over the epi material, e.g., the source and drain region 24 of the gate stack 18', the first sidewall spacer 22a, the remaining first spacer material 22 and within the space 26. In embodiments, the liner 28 can be deposited to a thickness of about 2 nm to 6 nm for 14 nm technology and beyond, depending on the dimensions of the space. The combination of the liner 28 and the first sidewall spacer 22a will form composite (or bi layer) sidewall spacers 22a' on the gate stack 18' and composite (or bi layer) sidewall spacers 22a" on the gate stack 18" of equal thickness as discussed further with reference to FIGS. 7 and 8. The liner 28 can be SiN material which will completely fill the space 26 adjacent to the gate stack 18'. The liner 28 can also be, for example, SiN, SiO₂, SiOCN, SiCN, SiCOH, or any low-K material. In embodiments, the liner 28 will have a lower dielectric constant than the first sidewall spacer 22, with the liner 28 occupying the space 26 between the raised source and drain region 24 and the first sidewall spacer 22. This will lower the capacitance between the gate stack and the raised source and drain region.

Figure 7:
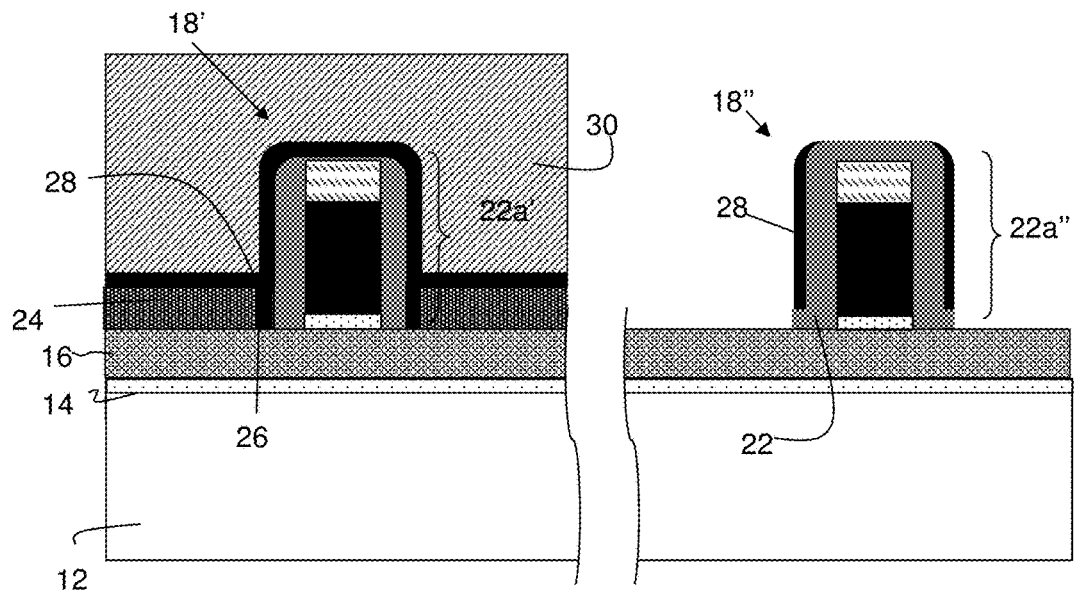

In FIG. 7, a masking material 30 is formed over the gate stack 18' (e.g., PFET), using conventional deposition and lithography processes as described herein. In embodiments, the masking material 30 can comprise bi-layer resist, e.g., resist and an optical planarization layer (OPL) or tri-layer resist, e.g., resist, Si or Ti containing ARC and OPL. The masking material 30 will be used to protect the gate stack 18' and more specifically the composite sidewall spacers 22a' on the gate stack 18' during subsequent processes, e.g., etching of the first spacer material 22 and liner 28 of the gate stack 18". More specifically, in embodiments, the first spacer material 22 and liner 28 on the unprotected horizontal surfaces of the structure, e.g., portions of the fins 16, upper surface of the gate stack 18" and portions of the insulator layer 14, are removed using an etching process, e.g., RIE, with a selective chemistry. In embodiments, this etching process is an isotropic etch, which will form composite sidewall spacers 22a" on the gate stack 18" (e.g., NFET). In embodiments, the composite sidewall spacers 22a" are formed from a combination of the first spacer material 22 and liner 28, with a thickness "X" equivalent to the sidewall spacers 22a' of the gate stack 18' (e.g., PFET). After the etching process, the resist can be removed using conventional stripping processes, e.g., oxygen ashing, etc.

Figure 8:
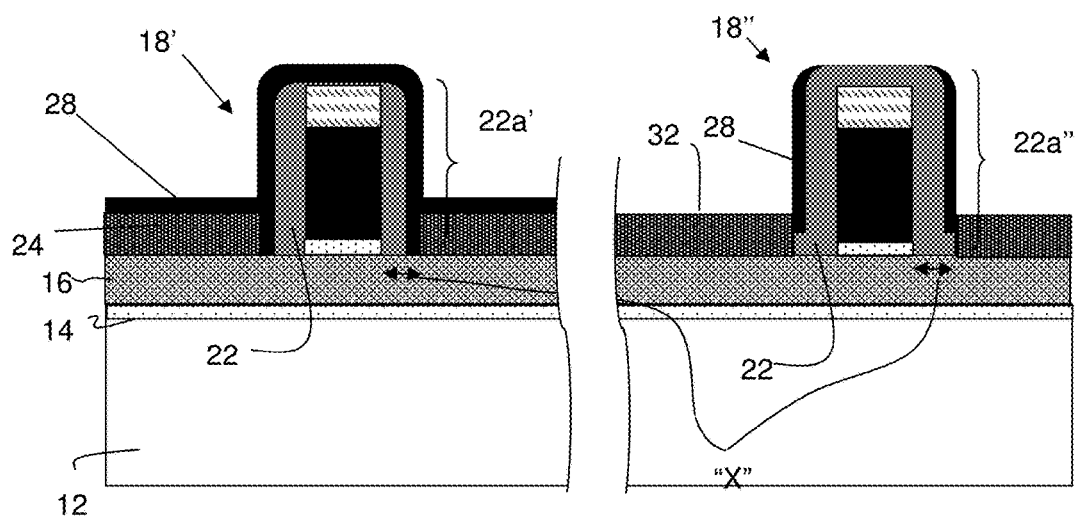

In FIG. 8, a raised source and drain region 32 is formed on either side of the gate stack 18". In embodiments, the raised source and drain region 32 is formed by an epitaxial growth process of semiconductor material. As shown in FIG. 8, the raised source and drain region 32 will abut directly against the composite sidewall spacers 22a" of the gate stack 18" (e.g., NFET).

Accordingly, by implementing the processes of the present invention the spacer thickness "X" for both the NFET (e.g., gate stack 18") and PFET (e.g., gate stack 18') are the same. By having a uniform (same) thickness, the source and drain regions for both the PFET and the NFET will also be spaced equally away from the respective gate stacks 18' and 18". In this way, the equal spacer thickness on both the NFET and PFET can boost device performance.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a first gate stack and a second gate stack over a fin structure;
   forming a spacer material over the first gate stack and the second gate stack;
   forming a sidewall spacer for the first gate stack by depositing a liner material over the spacer material on sidewalls of the first gate stack, wherein the liner material of the first gate stack extends to an upper surface of the fin structure;
   forming a sidewall spacer for the second gate stack by depositing the liner material over the spacer material on sidewalls of the second gate stack; and
   forming raised source and drain regions adjacent to the first gate stack and raised source and drain regions adjacent to the second gate stack,
   wherein a portion of the spacer material formed over the second gate stack is not covered by the liner material,
   wherein the liner material of the second gate stack is separated from the upper surface of the fin structure by the portion of the spacer material formed over the second gate stack which is not covered by the liner material, and
   wherein side surfaces of the raised source and drain regions for the second gate stack contact a side surface of the liner material covering a portion of the second gate stack and a side surface of the spacer material which is not covered by the liner material.

2. The method of claim 1, wherein the first gate stack is a PFET and the second gate stack is an NFET.

3. The method of claim 1, wherein side surfaces of the raised source and drain regions for the first gate stack contact the liner material covering a portion of the first gate stack, which liner material extends to the upper surface of the fin stack, and wherein the side surfaces of the raised source and drain regions for the first gate stack are separated from the spacer material by the liner material covering the portion of the first gate stack.

4. The method of claim 3, further comprising forming a space between the source and drain regions and the spacer material of the first gate stack by thinning the spacer material on sidewalls of the first gate stack and the second gate stack by an isotropic etching process.

5. The method of claim 4, wherein the isotropic etching process comprises a chemistry of hydrofluoric ethylene glycol (HFEG) which is selective to SiN based spacer material.

6. The method of claim 4, wherein the isotropic etching process comprises an HF-based wet chemistry for wet isotropic processes.

7. The method of claim 4, wherein the isotropic etching process comprises an isotropic dry etch process used with $NF_3/NH_3$ or $NH_3/HF$ based reactants.

8. The method of claim 4, wherein the space has a width dependent on a thickness of the liner material.

9. The method of claim 1, wherein the forming of the sidewall spacers comprises:
   blanket depositing the spacer material over the first gate stack and the second gate stack;
   forming the source and drain regions abutting the spacer material of the first gate stack; and
   thinning of the spacer material over the first gate stack and the second gate stack to create a space between the source and drain regions and the spacer material of the first gate stack.

10. The method of claim 9, wherein the forming of the sidewall spacers further comprises:
    depositing the liner material over the spacer material of the first gate stack and the second gate stack, including within the space; and
    removing the liner material and the spacer material formed on a substrate adjacent to the second gate stack.

11. The method of claim 1, wherein the spacer material is provided in a blanket deposition process to a thickness of about 3 nm to 15 nm and the liner material is provided in a blanket deposition process to a thickness of about 1 nm to 5 nm.

12. The method of claim 1, further comprising forming the source and drain regions for the second gate stack, abutting the sidewall spacers of the second gate stack, wherein the source and drain regions of the first gate stack and the second gate stack are formed by an epitaxial growth process of semiconductor material, which is doped in-situ.

13. The method of claim 4, wherein the liner material of the first gate stack extends into the space between the source and drain regions and the spacer material of the first gate stack to contact the upper surface of the fin structure.

14. The method of claim 13, wherein the liner material of the first gate stack has a lower dielectric constant than a dielectric constant of the spacer material of the first gate stack.

15. The method of claim 14, further comprising forming the space to have a width dependent on a thickness of the liner material, forming the spacer material to have a thickness of about 3 nm to 15 nm and forming the liner material to have a thickness of about 1 nm to 5 nm, wherein and the first gate stack and the second gate stack each include a dielectric layer formed in contact with an upper surface of the fin structure and in contact with inner walls of the spacer material, the dielectric layer being spaced apart from the liner material by the spacer material.

16. The method of claim 15, wherein the first gate stack and the second gate stack each include a conductive material formed on the dielectric layer, the conductive material being in contact with inner walls of the spacer material, the conductive material being spaced apart from the liner material by the spacer material, and the liner material of the first gate stack extends into the space between the source and drain regions and the spacer material of the first gate stack to contact the upper surface of the fin structure.

17. The method of claim 16, wherein the liner material is comprised of at least one of SiN, $SiO_2$, SiOCN, SiCN and SiCOH.

18. The method of claim 1, wherein the first gate stack and the second gate stack are formed over a plurality of fin structures.

19. The method of claim 1, wherein sidewall spacers of the first gate stack and the second gate stack are of equal thickness.

20. The method of claim 4, wherein the thickness of the liner material is equal to a width dimension of the space.

* * * * *